(12) United States Patent
McDaniel et al.

(10) Patent No.: US 11,569,402 B2
(45) Date of Patent: Jan. 31, 2023

(54) LUMINESCENT OPTICAL ELEMENTS FOR AGRICULTURAL APPLICATIONS

(71) Applicant: UbiQD, Inc., Los Alamos, NM (US)

(72) Inventors: Hunter McDaniel, Los Alamos, NM (US); Matthew Bergren, Los Alamos, NM (US)

(73) Assignee: UbiQD, Inc., Los Alamos, NM (US)

(*) Notice: Subject to any disclaimer, the term of this patent is extended or adjusted under 35 U.S.C. 154(b) by 203 days.

(21) Appl. No.: 16/612,344

(22) PCT Filed: May 9, 2018

(86) PCT No.: PCT/US2018/031918
§ 371 (c)(1),
(2) Date: Nov. 8, 2019

(87) PCT Pub. No.: WO2018/209000
PCT Pub. Date: Nov. 15, 2018

(65) Prior Publication Data
US 2020/0176625 A1 Jun. 4, 2020

Related U.S. Application Data

(60) Provisional application No. 62/503,851, filed on May 9, 2017.

(51) Int. Cl.
*B32B 15/04* (2006.01)
*B32B 17/06* (2006.01)
(Continued)

(52) U.S. Cl.
CPC ........ *H01L 31/0547* (2014.12); *A01G 9/1415* (2013.01); *B32B 17/10036* (2013.01);
(Continued)

(58) Field of Classification Search
CPC .......................... F24S 23/12; B32B 17/10669
(Continued)

(56) References Cited

U.S. PATENT DOCUMENTS

| 4,159,212 A | 6/1979 | Yerkes |
| 5,877,874 A | 3/1999 | Rosenberg |

(Continued)

FOREIGN PATENT DOCUMENTS

| ES | 2537029 A2 | 11/2013 |
| WO | WO2008013780 | * 1/2008 |

(Continued)

OTHER PUBLICATIONS

"Which regions of the electromagnetic spectrum do plants use to drive photosynthesis?", www.heliospectra.com (Oct. 5, 2012).

(Continued)

*Primary Examiner* — Lauren R Colgan
(74) *Attorney, Agent, or Firm* — John A. Fortkort; Fortkort & Houston PC

(57) ABSTRACT

An optical element is provided which comprises a plurality of fluorophores disposed in a medium. The fluorophores have a quantum yield greater than 50% and an absorption spectrum with a maximum intensity at wavelengths less than 400 nm, and emit a spectrum of light having a maximum intensity at wavelengths within the range of 400 nm to 1200 nm. The optical element is at least partially transparent over the visible region of the spectrum. The optical element is especially useful as a window or other optical component of a greenhouse structure.

25 Claims, 13 Drawing Sheets

(51) Int. Cl.
  *H01L 31/054* (2014.01)
  *F24S 23/00* (2018.01)
  *A01G 9/14* (2006.01)
  *B32B 17/10* (2006.01)
  *H01L 31/055* (2014.01)

(52) U.S. Cl.
  CPC ........ *B32B 17/10669* (2013.01); *F24S 23/12* (2018.05); *H01L 31/055* (2013.01)

(58) Field of Classification Search
  USPC ........................................................ 428/690
  See application file for complete search history.

(56) References Cited

U.S. PATENT DOCUMENTS

| | | | |
|---|---|---|---|
| 6,238,931 | B1 | 5/2001 | Buechler et al. |
| 6,837,039 | B2 | 1/2005 | Schenk et al. |
| 8,354,628 | B2 | 1/2013 | Schmaelzle et al. |
| 8,609,984 | B2 | 12/2013 | Bhattacharya et al. |
| 8,618,212 | B2 * | 12/2013 | Liu .................... C09K 11/025 524/588 |
| 8,743,462 | B2 | 6/2014 | Freier et al. |
| 8,889,983 | B2 | 11/2014 | Rider |
| 8,952,239 | B2 | 2/2015 | Pfenninger et al. |
| 9,728,735 | B2 | 8/2017 | Bulovic et al. |
| 2003/0175004 | A1 * | 9/2003 | Garito ................ G02B 6/02033 385/143 |
| 2009/0027872 | A1 | 1/2009 | Debije et al. |
| 2009/0032083 | A1 | 2/2009 | Torrance et al. |
| 2009/0229652 | A1 | 9/2009 | Mapel et al. |
| 2010/0270511 | A1 | 10/2010 | Locascio et al. |
| 2011/0240120 | A1 | 10/2011 | Ronda et al. |
| 2011/0253198 | A1 | 10/2011 | Patrick et al. |
| 2012/0024345 | A1 | 2/2012 | Reisfeld et al. |
| 2012/0138124 | A1 | 6/2012 | Scmueli et al. |
| 2012/0291852 | A1 | 11/2012 | Mapel et al. |
| 2013/0047503 | A1 | 2/2013 | Aikala et al. |
| 2013/0087193 | A1 | 4/2013 | Lui et al. |
| 2013/0333755 | A1 | 12/2013 | Lunt et al. |
| 2014/0000704 | A1 | 1/2014 | Farahi |
| 2014/0117253 | A1 * | 5/2014 | Edwards ............ C09K 11/7734 250/458.1 |
| 2014/0130864 | A1 | 5/2014 | Lunt et al. |
| 2014/0182676 | A1 | 7/2014 | Rosenberg et al. |
| 2014/0283896 | A1 | 9/2014 | Lunt, III et al. |
| 2014/0352762 | A1 * | 12/2014 | Carter .................... A01G 9/249 136/247 |
| 2014/0376098 | A1 | 12/2014 | Rider |
| 2016/0268962 | A1 * | 9/2016 | Xue ......................... B32B 3/08 |
| 2016/0327228 | A1 | 11/2016 | Farkas et al. |
| 2017/0341346 | A1 * | 11/2017 | McDaniel ............... B32B 17/08 |

FOREIGN PATENT DOCUMENTS

| | | |
|---|---|---|
| WO | 2009002943 A2 | 12/2008 |
| WO | 2010132955 A1 | 11/2010 |
| WO | 2012052041 A1 | 4/2012 |
| WO | 2013003828 A2 | 1/2013 |
| WO | 2015079094 A1 | 6/2015 |
| WO | 2016060643 A1 | 4/2016 |
| WO | 2016120264 A1 | 8/2016 |

OTHER PUBLICATIONS

K. J. McCree, "The Action Spectrum, Absorptance and Quantum Yield of Photosynthesis in Crop Plants", Agric. Meteorol., 9 (1971/1972) 191-216.

"Light Absorption for Photosynthesis", http://hyperphysics.phyastr.gsu.edu/hbase/Biology/ligabs.html, downloaded Mar. 27, 2017.

"Luminescent Solar Concentrator", https://www.4tu.nl/bouw/en/PDEng/Luminescent%20Solar%20Concentrator, downloaded Apr. 13, 2017.

Wilfried G.J.H.M. van Sark et al., "Luminescent Solar Concentrators—A review of recent results", vol. 16, No. 26, Optics Express 21773 (Dec. 22, 2008).

Mumin et al., "Quantum dots/silica/polymer nanocomposite films with high visible light transmission and UV shielding properties", Nanotechnology. Aug. 7, 2015;26(31):315702.

S.J. Gallagher et al., "Quantum dot solar concentrators: Electrical conversion efficiencies and comparative concentrating factors of fabricated devices", Solar Energy 81 (2007) 813-821.

Md Abdul Mumin et al., "Quantum dots/silica/polymer nanocomposite films with high visible light transmission and UV shielding properties", Nanotechnology 26 (2015) 315702 (14pp) doi:10.1088.

Andy Murdock, "This solar greenhouse could change the way we eat", http://news.ucsc.edu/2016/05/solargreenhouse.html 1, May 25, 2016.

* cited by examiner

1201 – Structure
1203 – Diffuse Film with fluorophores
1209 – Solar radiation
1211 – emitted light
1213 – plants

US 11,569,402 B2

LUMINESCENT OPTICAL ELEMENTS FOR AGRICULTURAL APPLICATIONS

CROSS-REFERENCE TO RELATED APPLICATION

This application is a national stage filing of PCT/US18/31918, filed on May 9, 2018, having the same inventors and the same title, and which is incorporated herein by referenced in its entirety; which claims the benefit of priority from U.S. provisional application No. 62/503,851, filed May 9, 2017, having the same inventors and the same title, and which is incorporated herein by referenced in its entirety.

FIELD OF THE DISCLOSURE

The present disclosure relates generally to down-conversion materials and devices, and more specifically to fluorescent materials usage in agricultural applications.

BACKGROUND OF THE DISCLOSURE

Luminescent solar concentrators (LSCs) are devices which utilize luminescent materials to concentrate solar radiation, typically for the purpose of generating electricity. A common set-up 101 of such a device for this purpose is depicted in FIG. 1. As seen therein, the solar concentrator 103 is utilized to collect solar radiation 109 over a relatively large area, and to concentrate it onto a relatively small area (here, the active surface of a photovoltaic cell 105). The photovoltaic cell 105 then converts the radiation into electricity to provide power for end user devices. One of the first reports of an LSC can be found in U.S. Ser. No. 06/001,585 (Zewail et al), entitled "Luminescent Solar Energy Concentrator Devices," filed in 1979, which notes that "Snell's law dictates that a large fraction, typically 75%, of this reemission strikes the surface of the substrate with an angle of incidence greater than the critical angle, so that this fraction of the light is then trapped in the substrate by internal reflection until successive reflection carries it to the edge of the plate where it enters an absorber placed at the edge of the plate."

Since electricity is one of the biggest expenses for a greenhouse operator or indoor plant grower, there are opportunities for LSCs to be used in agriculture. This type of approach was applied in U.S. Ser. No. 14/372,389 (Carter et al), entitled "Luminescent Electricity-Generating Window for Plant Growth" and filed in 2012, which notes that "there is a need in the art for luminescent solar collectors which are can produce power with no harm to plant growth." Another approach to generating electricity for a greenhouse can be found in U.S. Ser. No. 12/505,523 (Chuang et al), entitled "Photovoltaic Greenhouse Structure," filed in 2009, which notes that "light which is not absorbed by the thin-film solar cell module freely passes through the thin-film solar cell module and enters the greenhouse inner space."

Referring again to FIG. 1, the solar concentrator 103 is essentially an optical waveguide comprising a luminescent material which is embedded in a substrate. The substrate is typically glass or a polymeric material of optical quality. When solar radiation impinges on the luminescent material, the luminescent material undergoes luminescence (and most commonly, fluorescence), and emits light into the waveguide. From there, the entrapped light is directed to the photovoltaic cell 105. Since the radiation emitted by the luminescent material through fluorescence is typically emitted at different wavelengths than the radiation initially absorbed by the luminescent material, the solar concentrator 103 has the effect of both concentrating and modifying the spectral footprint of the radiation which is impingent on it.

There have been attempts to utilize fluorescent materials to enhance plant growth. For example, U.S. Pat. No. 3,352,058 (Brant), entitled "Organic Fluorescent Colorants For Stimulating The Growth Of Plants", and filed in 1966, notes that "if the colorant is properly selected so that the transmitted light is predominantly composed of red and blue wave lengths with a minimum of green wave lengths, optimum results are frequently achieved." This approach is lacking because a purely down conversion film will lose roughly 50% of the light by fluorescence back out of the top of the film (directed away from the plants). Additionally, approaches such as those employed by Zewail, Brant and Carter rely on dyes wherein blue light is mostly transmitted, whereas there are many situations where blue light should be a small fraction of the spectrum incident on the plants. For example, in the paper titled "Sensitivity of Seven Diverse Species to Blue and Green Light: Interactions with Photon Flux" by Snowden et al., published in PLOS ONE in 2016, it is stated that "at the higher photosynthetic photon flux (500 micromoles $m^{-2}$ $s^{-1}$), increasing blue light in increments from 11 to 28% reduced growth in tomato, cucumber, and pepper by 22, 26, and 14% respectively, . . . " Additionally, dyes suffer strongly from instability under sunlight.

There have been attempts to modify the directionality of sunlight to enhance plant growth without waveguides, relying instead on scattering. For example, U.S. Ser. No. 13/064,600 (Krasnov), entitled "Light Scattering Coating For Greenhouse Applications, And/Or Coated Article Including The Same", filed in 2011, states that "(a) light having a wavelength of greater than or equal to about 800 nm incident thereon to primarily scatter to angles less than 30 degrees relative to a major surface of the substrate and (b) light having a wavelength of less than or equal to about 700 nm incident thereon to primarily scatter to angles greater than 20 degrees relative to the major surface of the substrate." The approach suffers from attenuation through the film due to scattering which lowers the amount of useful light impinging on plants, and also from lack of wavelength conversion capability which would shift photons from one range of the spectrum to another more useful range.

SUMMARY OF THE DISCLOSURE

Figure 1:
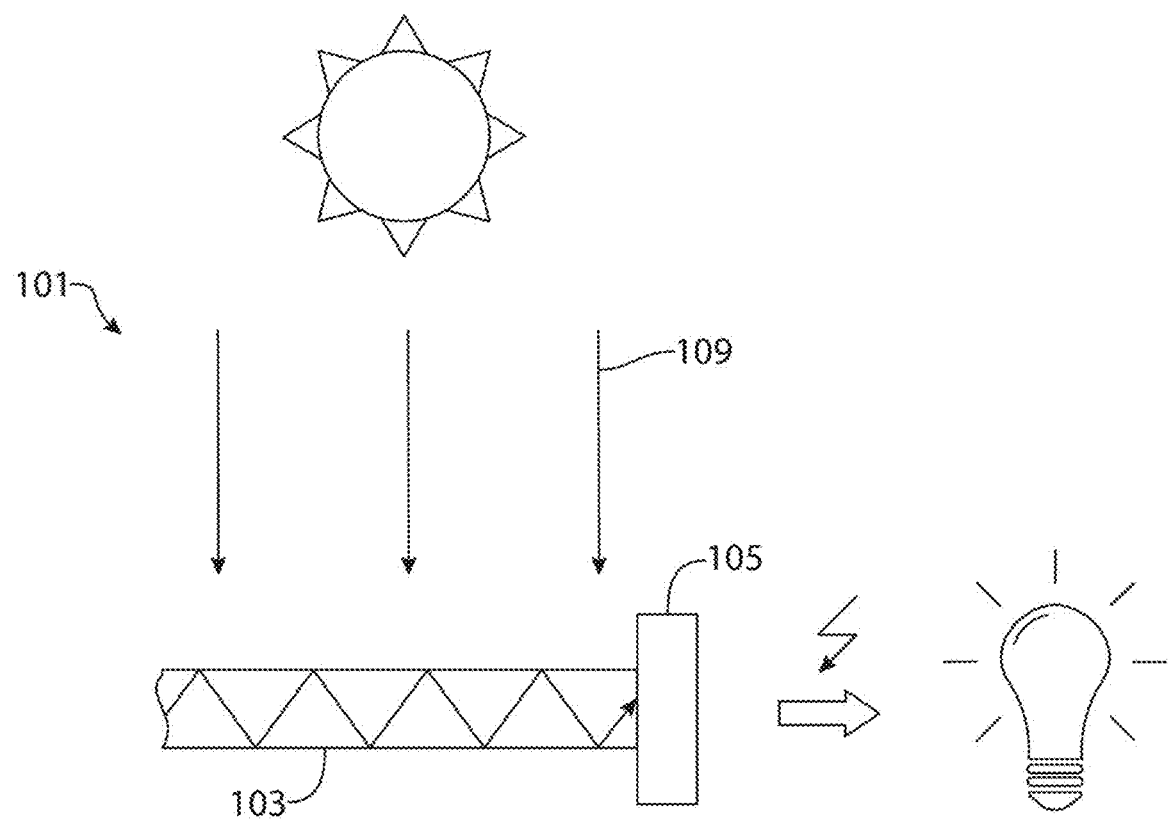
FIG. 1 is an illustration of the use of a luminescent solar concentrator in conjunction with a photovoltaic cell for the purposes of producing electricity.

In one aspect, an optical element is provided which comprises a plurality of fluorophores disposed in a medium; wherein said fluorophores have a quantum yield greater than 50%, wherein said fluorophores have an absorption spectrum with a maximum intensity at wavelengths less than 400 nm, wherein said fluorophores emit a spectrum of light having a maximum intensity at wavelengths within the range of 400 nm to 1200 nm, and wherein said medium is partially transparent over the visible region of the spectrum.

In another aspect, a method is provided for modifying the wavelengths of solar radiation incident on a plant. The method comprises providing an optical element having a solid, partially transparent medium with a plurality of fluorophores disposed therein, wherein said fluorophores have a quantum yield greater than 50% and emit a spectrum of light having a maximum intensity at wavelengths greater than 550 nm; and disposing the optical element in an optical path between said plant and a source of solar radiation.

In a further aspect, a structure is provided which comprises a roof, a wall, a structural element which supports said roof or said wall, and a waveguide which is disposed in said structural element and which directs light incident thereon into the interior of said building, wherein said waveguide has a plurality of fluorophores disposed therein, wherein said fluorophores have a quantum yield greater than 50%, wherein said fluorophores have an absorption spectrum with a maximum intensity at wavelengths less than 400 nm, and wherein said fluorophores emit a spectrum of light having a maximum intensity at wavelengths within the range of 400 nm to 1200 nm.

In still another aspect, an optical element is provided which comprises a reflective substrate; a polymeric coating disposed on said substrate; and a plurality of fluorophores disposed in said polymeric coating; wherein said fluorophores have a quantum yield greater than 50%, wherein said fluorophores, upon excitation with sunlight, emit a spectrum of light having a maximum intensity in the visible region of the spectrum, and wherein said medium is translucent over the visible region of the spectrum.

DETAILED DESCRIPTION

1. Definitions and Abbreviations

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly indicates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure relates. Suitable methods and compositions are described herein for the practice or testing of the compositions, systems and methodologies described herein. However, it is to be understood that other methods and materials similar or equivalent to those described herein may be used in the practice or testing of these compositions, systems and methodologies. Consequently, the compositions, materials, methods, and examples disclosed herein are illustrative only, and are not intended to be limiting. Other features of the disclosure will be apparent to those skilled in the art from the following detailed description and the appended claims.

Unless otherwise indicated, all numbers expressing quantities of components, percentages, temperatures, times, and so forth, as used in the specification or claims are to be understood as being modified by the term "about." Unless otherwise indicated, non-numerical properties such as colloidal, continuous, crystalline, and so forth as used in the specification or claims are to be understood as being modified by the term "substantially," meaning to a great extent or degree. Accordingly, unless otherwise indicated implicitly or explicitly, the numerical parameters and/or non-numerical properties set forth are approximations that may depend on the desired properties sought, the limits of detection under standard test conditions or methods, the limitations of the processing methods, and/or the nature of the parameter or property. When directly and explicitly distinguishing embodiments from discussed prior art, the embodiment numbers are not approximations unless the word "about" is recited.

Carcinogen: A material that has been shown to directly or indirectly cause cancer in any mammal.

Photoluminescence (PL): The emission of light (electromagnetic radiation, photons) after the absorption of light. It is one form of luminescence (light emission) and is initiated by photoexcitation (excitation by photons).

Toxic: Denotes a material that can damage living organisms due to the presence of phosphorus or heavy metals such as cadmium, lead, or mercury.

Quantum Dot (QD): A nanoscale particle that exhibits size-dependent electronic and optical properties due to quantum confinement. The quantum dots disclosed herein preferably have at least one dimension less than about 50 nanometers. The disclosed quantum dots may be colloidal quantum dots, i.e., quantum dots that may remain in suspension when dispersed in a liquid medium. Some of the quantum dots which may be utilized in the compositions, systems and methodologies described herein are made from a binary semiconductor material having a formula MX, where M is a metal and X typically is selected from sulfur, selenium, tellurium, nitrogen, phosphorus, arsenic, antimony or mixtures thereof. Exemplary binary quantum dots which may be utilized in the compositions, systems and methodologies described herein include CdS, CdSe, CdTe, PbS, PbSe, PbTe, ZnS, ZnSe, ZnTe, InP, InAs, $Cu_2S$, and $In_2S_3$. Other quantum dots which may be utilized in the compositions, systems and methodologies described herein are ternary, quaternary, and/or alloyed quantum dots including, but not limited to, ZnSSe, ZnSeTe, ZnSTe, CdSSe, CdSeTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, CdHgSeTe, $CuInS_2$, $CuInSe_2$, $CuInGaSe_2$, $CuInZnS_2$, $CuZnSnSe_2$, $CuIn(Se,S)_2$, $CuInZn(Se,S)_2$, and $AgIn(Se,S)_2$ quantum dots, although the use of non-toxic quantum dots is preferred. Embodiments of the disclosed quantum dots may be of a single material, or may comprise an inner core and an outer shell (e.g., a thin outer shell/layer formed by any suitable method, such as cation exchange). The quantum dots may further include a plurality of ligands bound to the quantum dot surface.

Quantum Yield (QY): The ratio of the number of emitted photons to the number of absorbed photons for a fluorophore.

Fluorophore: a material which absorbs a first spectrum of light and emits a second spectrum of light.

Stokes shift: the difference in energy between the positions of the absorption shoulder or local absorption maximum and the maximum of the emission spectrum.

Emission spectrum: Those portions of the electromagnetic spectrum over which a photoluminescent material exhibits photoluminescence (in response to excitation by a light source) whose amplitude is at least 1% of the peak PL emission.

Luminescent concentrator (LC): A device for converting a spectrum and photon flux of electromagnetic radiation into a new narrower spectrum with a higher photon flux. LCs operate on the principle of collecting radiation over a large area by absorption, converting it to a new spectrum by PL, and then directing the generated radiation into a relatively small output target by total internal reflection.

Photon flux: The number of photons passing through a unit of area per unit of time, typically measured as counts per second per square meter.

Polymer: A large molecule, or macromolecule, composed of many repeated subunits. Polymers range from familiar synthetic plastics such as polystyrene or poly(methyl methacrylate) (PMMA), to natural biopolymers such as DNA and proteins that are fundamental to biological structure and function. Polymers, both natural and synthetic, are created via polymerization of many small molecules, known as monomers. Exemplary polymers include poly(methyl methacrylate) (PMMA), polystyrene, ionoplasts, silicones, epoxy resins, and nail polish.

Self-absorption: The percentage of emitted light from a plurality of fluorophores that is absorbed by the same plurality of fluorophores.

2. Overview

Greenhouses are a staple of agriculture. In addition to extending growing seasons, greenhouses provide a highly-controlled environment for plant growth, limit exposure to pests and provide additional security for growing high value plants. Consequently, plants may be grown in greenhouses under optimized conditions, and with a much lower reliance on pesticides than plants in a field. For this reason, the use of greenhouses has become especially prevalent in the organic foods industry.

Despite their many advantages, conventional greenhouses do not make optimal use of the solar radiation which impinges upon them. In particular, much of the UV portion of the incident radiation is not required for plant growth. Indeed, some greenhouses are equipped with UV reflective films or have UV absorbing additives embedded in the greenhouse sheeting, since UV radiation tends to degrade various plastics that are frequently used in greenhouses.

Moreover, many greenhouses provide an uneven distribution of incident solar radiation to the plants within the greenhouse. For example, at different times of the day, the incident sunlight available to a plant may be blocked by other plants, or by the greenhouse structure itself. Moreover, in conventional greenhouses, the changing location of the sun throughout the day causes an uneven illumination of different parts of the interior of the greenhouse.

It has now been found that some or all of the foregoing issues may be overcome with the devices, structures and methodologies disclosed herein. In a preferred embodiment, these devices, structures and methodologies use solar concentrators to concentrate, spectrally modify, and redistribute incident solar radiation to plants within a greenhouse (rather than in their conventional role, in which they are utilized in conjunction with photovoltaic cells for the generation of electricity).

In this application, the spectral footprint of the solar concentrator may be modified or tuned as desired to achieve a spectral output that is advantageous to plant growth. In particular, the luminescent material in the solar concentrator may be advantageously selected or modified to absorb radiation outside of the spectral region utilized by plants, and to emit (e.g., through fluorescence) radiation at wavelengths conducive to plant growth. Thus, for example, the luminescent material in the solar concentrator may be advantageously selected or modified to absorb radiation in the ultraviolet region of the spectrum, and to emit radiation at the visible wavelengths most useful for agricultural purposes. It will be appreciated that this repurposing of the incident solar radiation has the effect of increasing the flux of wavelengths used for photosynthesis within the greenhouse which are most beneficial to plant growth.

In addition, solar concentrators may be equipped with waveguides of any desired dimensions. Accordingly, use of these devices adds considerable flexibility with respect to interior lighting. In particular, the emitting portions of the waveguides may be placed wherever they will provide the best illumination of the interior of the greenhouse.

In a preferred embodiment, the luminescent material comprises a plurality of fluorophores (such as, for example, CuInZnSeS quantum dots) which are disposed within or upon a substrate. The fluorophores have a quantum yield greater than 50% and an absorption spectrum with a maximum intensity at wavelengths less than 400 nm, and emit a spectrum of light having a maximum intensity at wavelengths within the range of 400 nm to 1200 nm.

3. Description of Specific Embodiments

Figure 2:
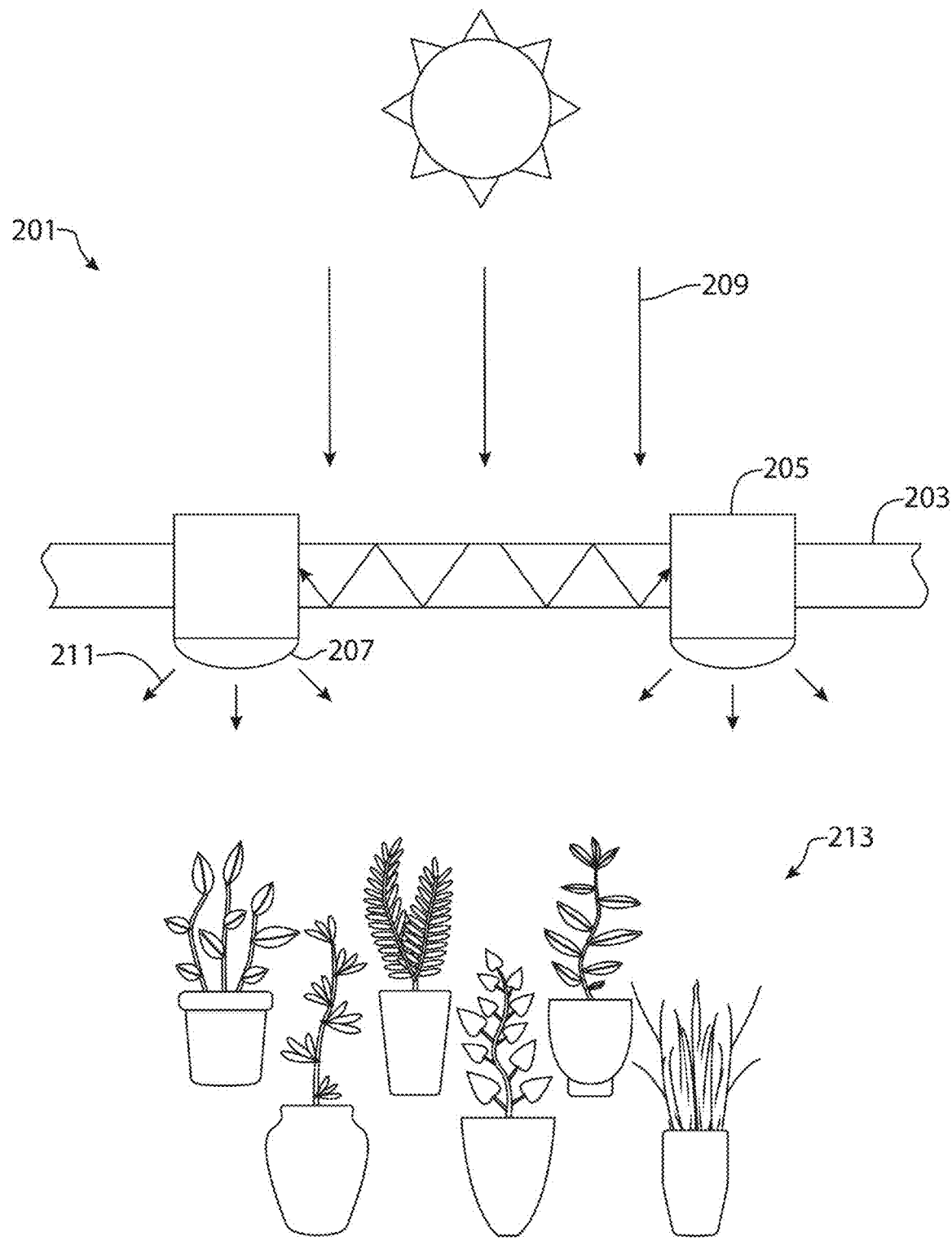
FIG. 2 is an illustration of a greenhouse equipped with a luminescent concentrator in accordance with the teachings herein.

FIG. 2 depicts a first particular, non-limiting embodiment of a structure in accordance with the teachings herein. As seen therein, the structure 201 depicted is equipped with a series of transparent or partially transparent panels 203 or windows which, in the particular embodiment depicted, form the walls and/or ceilings of a greenhouse. The panels 203 are supported by a series of struts or other suitable structural elements 205. The details of the structure, and the general arrangement of the panels, are not shown, but may be any of the various structures and arrangements as are known to the art of greenhouses.

Each of the panels 203 in the structure 201 depicted comprises a suitable fluorophore disposed on a transparent substrate (or in some embodiments, disposed in a transparent medium). Suitable substrates include various plastics and glasses. The panels are generally constructed so that they act as solar concentrators for solar radiation impingent thereon.

In use, solar radiation 209 impinges on said panels 203, and is directed through the waveguides thereof (typically to the edges of the panels). The fluorophores in the waveguides are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the waveguides.

The light is then extracted from the waveguide with a suitable extractor 207 such as, for example, a diffusely transmissive film disposed on a surface of the waveguide and in optical communication therewith. The emitted light 211 is directed into the interior of the greenhouse, where it impinges upon plants 213 or vegetation resident therein.

It will be appreciated that the use of solar concentrators in accordance with the teachings herein allow incident sunlight to be redirected, and spectrally modified, in a controlled manner so that the interior of the greenhouse may be more uniformly illuminated. Moreover, the solar concentrators allow a portion of the UV spectrum to be converted into visible wavelengths through the phenomenon of fluorescence, thus increasing the flux of these wavelengths and hence allowing for more vigorous plant growth.

Figure 3:
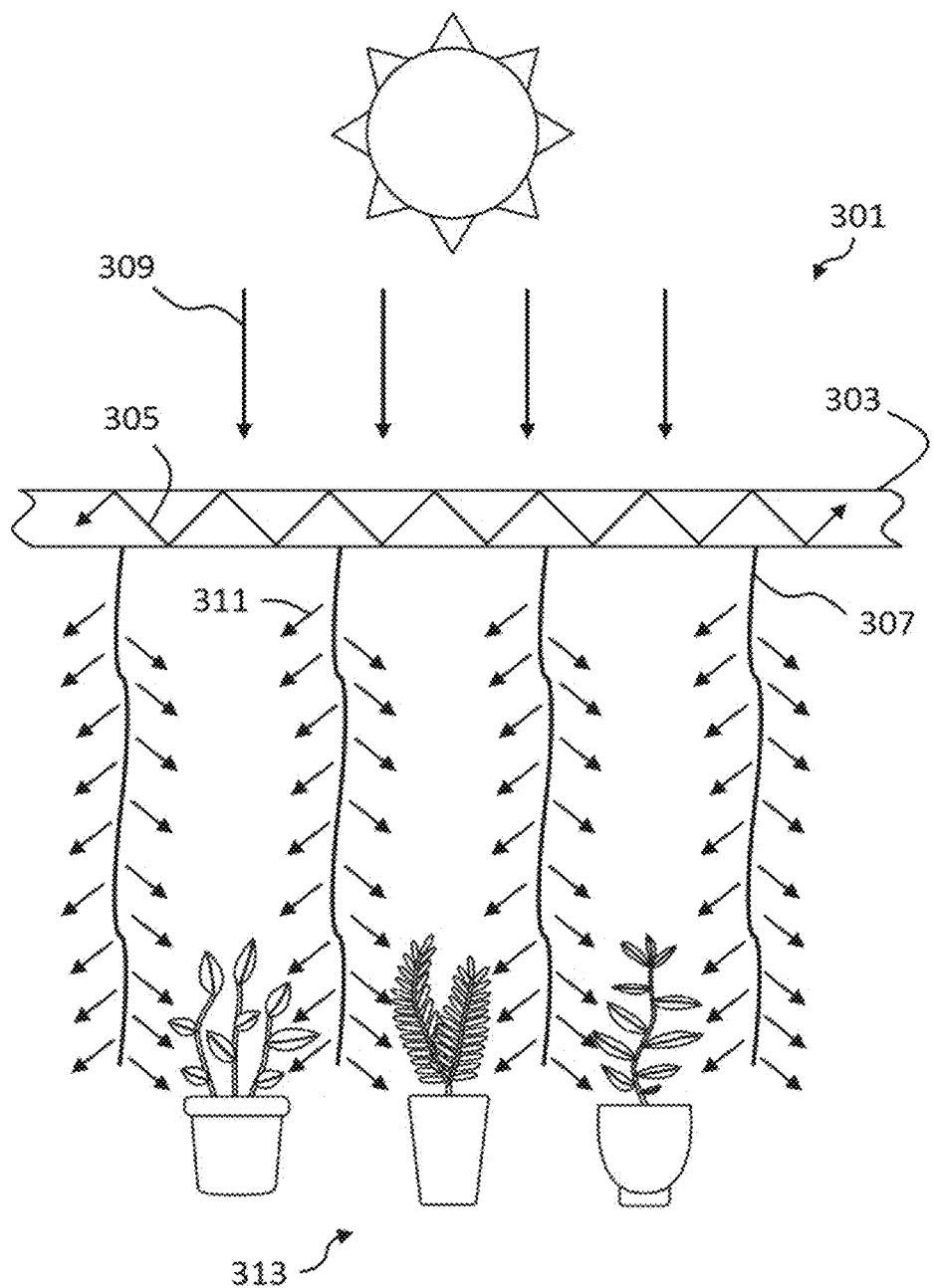
FIG. 3 is an illustration of a greenhouse equipped with a luminescent concentrator in combination with light extraction optics in accordance with the teachings herein.

FIG. 3 depicts a second particular, non-limiting embodiment of a structure in accordance with the teachings herein. As seen therein, the structure 301 depicted is equipped with a series of transparent or partially transparent panels 303 or windows which, in the particular embodiment depicted, form the walls and/or ceilings of a greenhouse. The details of the structure, and the general arrangement of the panels, are not shown, but may be any of the various structures and arrangements as are known to the art of greenhouses.

Each of the panels 303 in the structure 301 depicted comprises a suitable fluorophore disposed on a transparent substrate (or in some embodiments, disposed in a transparent medium). Suitable substrates include various plastics and glasses. The panels are generally constructed so that they act as solar concentrators for solar radiation impingent thereon.

In use, solar radiation 309 impinges on said panels 303, and is directed through the waveguides thereof (typically to the edges of the panels). The fluorophores in the waveguides are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the waveguides.

The light is then extracted from the waveguide with a suitable extractor 307, which in this particular embodiment is a flexible fiber optic waveguide. The light extractor 307 then can be placed in optimal locations in the interior of the greenhouse where the emitted light 311 from the light extractor 307 impinges upon plants 313 or vegetation resident therein.

The extra light that is extracted and impinges on the plants 313 or vegetation resident can increase crop yield by 1% or greater by enhancing photosynthesis or it can result in faster plant growth by a factor of 2 times. The spectrum of light can also affect the physiology of the plant and result in larger or more fruit, flowers, or leaves.

Figure 4:
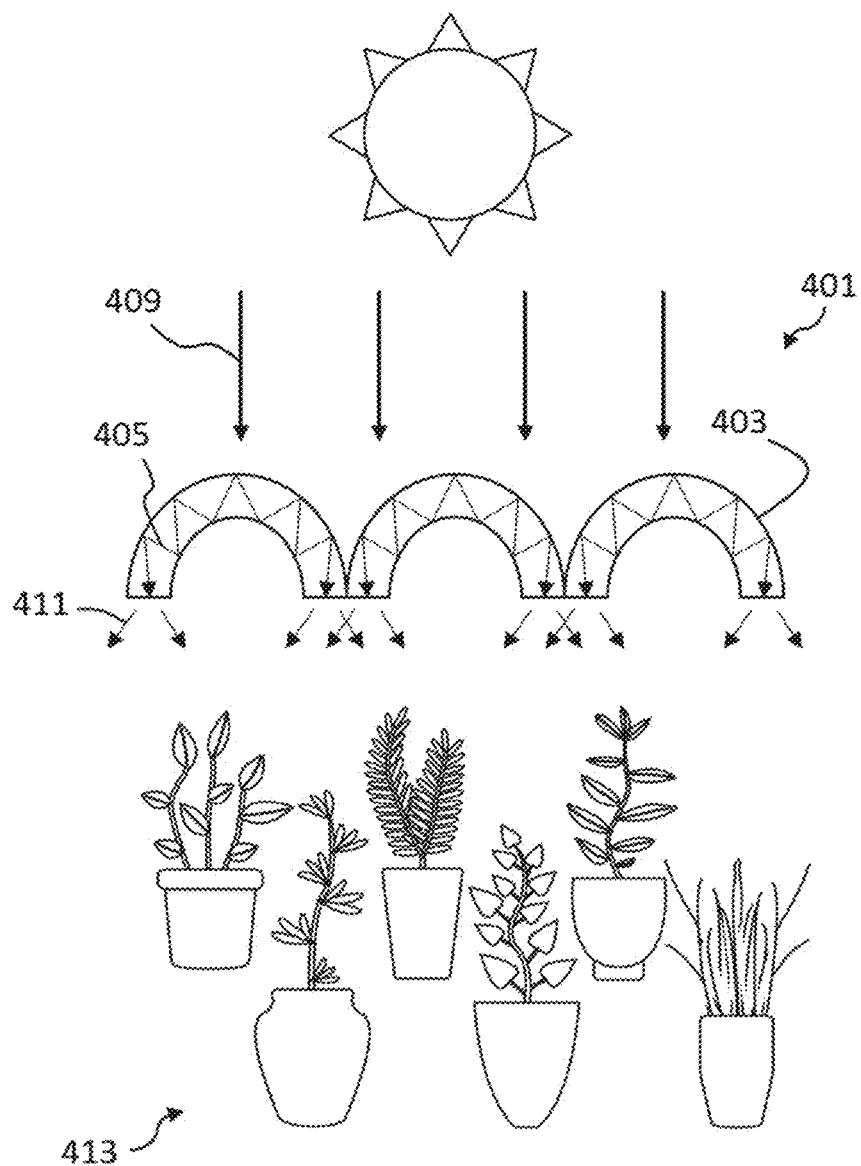
FIG. 4 is an illustration of a greenhouse equipped with curved luminescent concentrators for the roof and/or side structural elements

FIG. 4 depicts a third particular, non-limiting embodiment of a structure in accordance with the teachings herein. As seen therein, the structure 401 depicted is equipped with a series of curved transparent or partially transparent panels 403 or windows which, in the particular embodiment depicted, form the walls and/or ceilings of a greenhouse. The details of the structure, and the general arrangement of the panels, are not shown, but may be any of the various structures and arrangements as are known to the art of greenhouses.

Each of the curved panels 403 in the structure 401 depicted comprises a suitable fluorophore disposed on a transparent substrate (or in some embodiments, disposed in a transparent medium). Suitable substrates include various plastics and glasses. The panels are generally constructed so that they act as solar concentrators for solar radiation impingent thereon.

In use, solar radiation 409 impinges on said curved panels 403, and is directed through the waveguides thereof (typically to the edges of the panels). The fluorophores in the waveguides are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the waveguides. The waveguided light 405 is then emitted from the ends of the curved panels 403 and the emitted light 411 impinges upon plants 413 or vegetation resident therein. In some variations of this embodiment, the curved panels may be covered by a protective film or paneling, which is preferably substantially transparent to the wavelengths of interest in this application.

Figure 5:
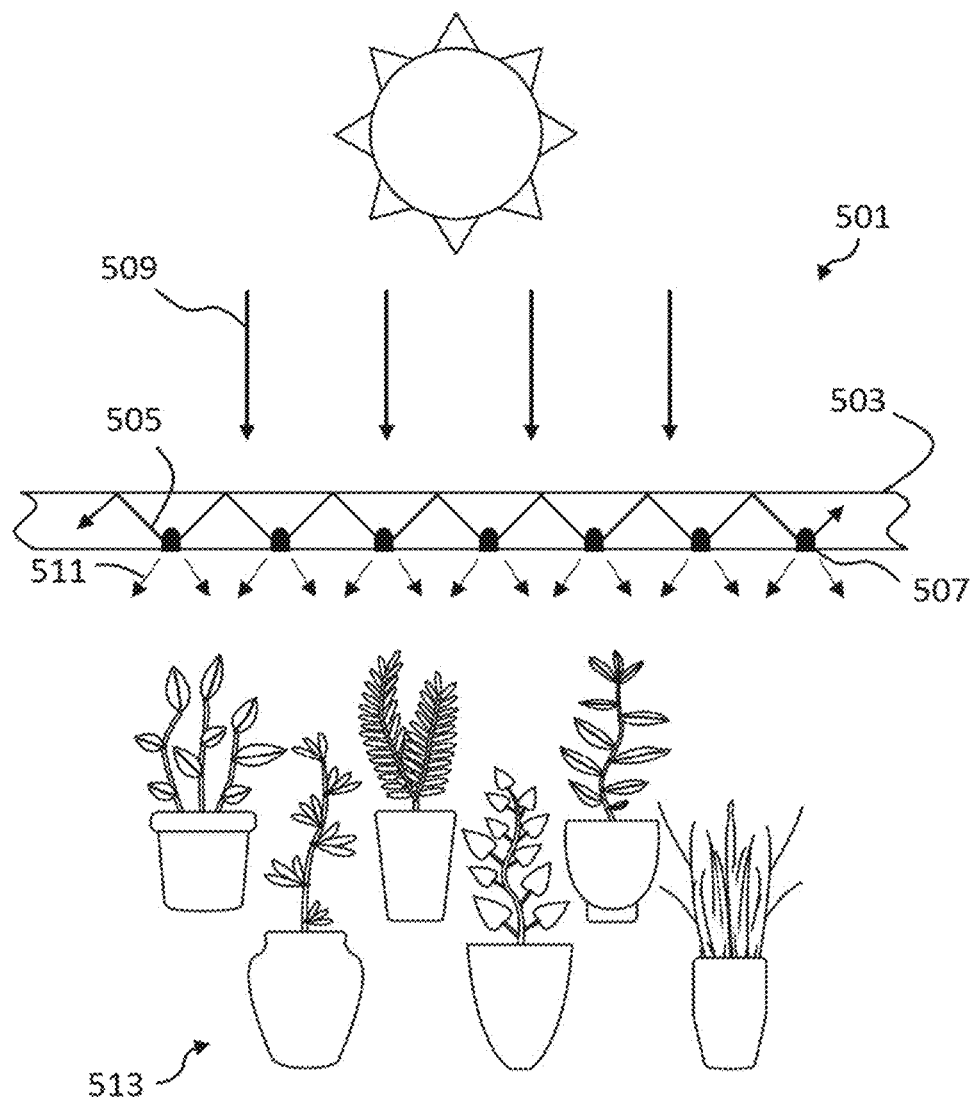
FIG. 5 is an illustration of a greenhouse equipped with a luminescent concentrator in combination with light extraction elements incorporated into the luminescent concentrator

FIG. 5 depicts a fourth particular, non-limiting embodiment of a structure in accordance with the teachings herein. As seen therein, the structure 501 depicted is equipped with a series of transparent or partially transparent panels 503 or windows which, in the particular embodiment depicted, form the walls and/or ceilings of a greenhouse. The details of the structure, and the general arrangement of the panels, are not shown, but may be any of the various structures and arrangements as are known to the art of greenhouses.

Each of the panels 503 in the structure 501 depicted comprises a suitable fluorophore disposed on a transparent substrate (or in some embodiments, disposed in a transparent medium). Suitable substrates include various plastics and glasses. The panels are generally constructed so that they act as solar concentrators for solar radiation impingent thereon.

In use, solar radiation 509 impinges on said panels 503, and is directed through the waveguides thereof (typically to the edges of the panels). The fluorophores in the waveguides are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the waveguides.

The waveguided light 505 is then extracted from the waveguide with a suitable extractor 507, which in this particular embodiment is incorporated into the said panels 503. The light extractor 507 then allows for the emitted light 511 to impinge upon plants 513 or vegetation resident therein.

Figure 6:
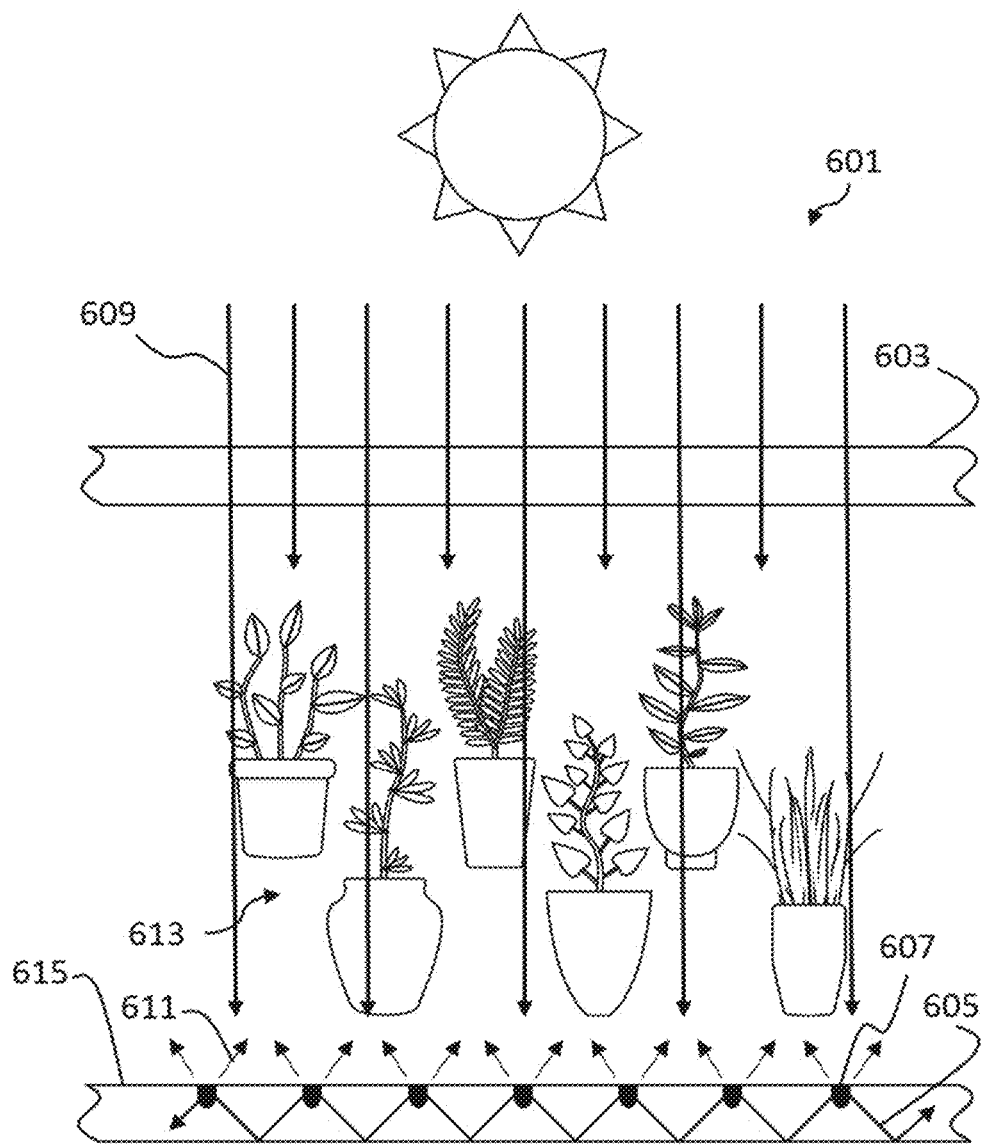
FIG. 6 is an illustration of a greenhouse equipped with a luminescent concentrator placed on the floor of the greenhouse to emit light back onto plants from below.

FIG. 6 depicts a fifth particular, non-limiting embodiment of a structure in accordance with the teachings herein. As seen therein, the structure 601 depicted is equipped with a series of transparent or partially transparent panels 603 or windows which, in the particular embodiment depicted, form the walls and/or ceilings of a greenhouse. The details of the structure, and the general arrangement of the panels, are not shown, but may be any of the various structures and arrangements as are known to the art of greenhouses.

In this particular embodiment, a luminescent concentrator 615 is located below the plants 613 or other vegetation resident within the structure. Moreover, in this particular embodiment, the luminescent concentrator 615 depicted comprises a suitable fluorophore disposed on a transparent substrate (or in some embodiments, disposed in a transparent medium). Suitable substrates include various plastics and glasses. The panels are generally constructed so that they act as solar concentrators for solar radiation impingent thereon.

In use, solar radiation 609 impinges on said plants 613 in the greenhouse, and any solar radiation 609 not absorbed by the plants impinges on said luminescent concentrator 615 located below the plants and is directed through the waveguides thereof. The fluorophores in the waveguides are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the waveguides.

The waveguided light 605 is then extracted from the waveguide with a suitable extractor 607 which, in this particular embodiment, is incorporated into the luminescent concentrator 615. The light extractor 607 then allows for the emitted light 611 to impinge upon plants 613 or vegetation resident therein from below, thus maximizing the absorption of light by the plants 613 inside the greenhouse.

Figure 7:
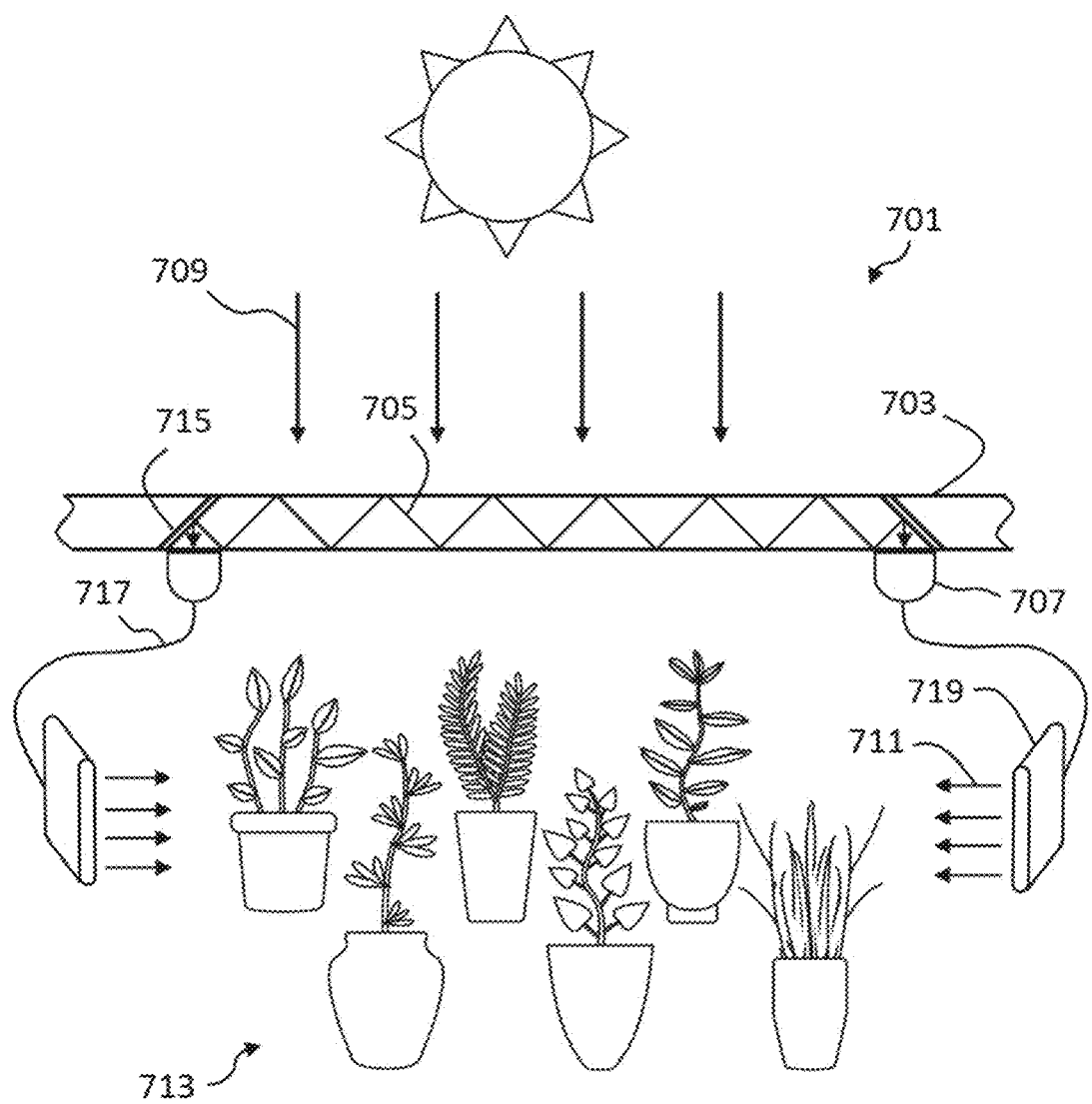
FIG. 7 is an illustration of a greenhouse equipped with a luminescent concentrator in combination with at least one reflective optical element, at least one light extraction optical element, a fiber optic and a light emitter that can be placed in optimal locations within the greenhouse to better illuminate plants.

FIG. 7 depicts a sixth particular, non-limiting embodiment of a structure in accordance with the teachings herein. As seen therein, the structure 701 depicted is equipped with a series of transparent or partially transparent panels 703 or windows which, in the particular embodiment depicted, form the walls and/or ceilings of a greenhouse. The details of the structure, and the general arrangement of the panels, are not shown, but may be any of the various structures and arrangements as are known to the art of greenhouses.

Each of the panels 703 in the structure 701 depicted comprises a suitable fluorophore disposed on a transparent substrate (or in some embodiments, disposed in a transparent medium). Suitable substrates include various plastics and glasses. The panels are generally constructed so that they act as solar concentrators for solar radiation impingent thereon.

In use, solar radiation 709 impinges on said panels 703, and is directed through the waveguides thereof to a reflective optic 715. The fluorophores in the waveguides are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the waveguides.

The waveguided light 705 is then reflected off of the reflective optic 715 and is extracted from the waveguide with a suitable light extractor 707. The said light extractor 707 then directs the waveguided light 705 into another waveguide, which in this particular example is a flexible optical fiber 717. The waveguided light 705 is then directed to a portable light emitter 719 that can be optimally placed in the greenhouse to deliver the emitted light 711 to the plants 713 or vegetation resident therein.

Figure 8:
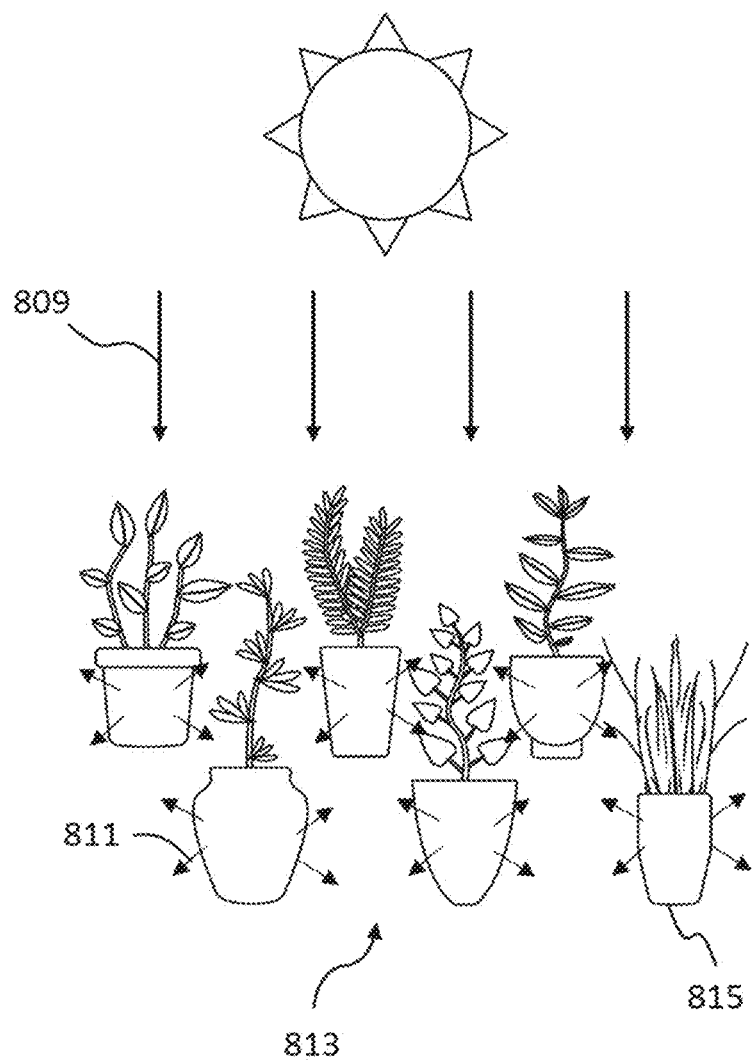
FIG. 8 is an illustration of plants that are placed into containers that are equipped with a luminescent concentrator.

FIG. 8 depicts a particular, non-limiting embodiment of a luminescent concentrator in accordance with the teachings herein. As seen therein, plants 813 are placed into a container which is comprised of a luminescent concentrator 815.

In use, solar radiation 809 impinges on said plants 813, and any solar radiation 809 not absorbed by the plants impinges on said luminescent concentrator 815. The fluorophores in the luminescent concentrator 815 are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the luminescent concentrator 815.

The luminescent concentrator 815 then allows for the emitted light 811 to impinge upon plants 813 or vegetation resident therein from below, thus maximizing the absorption of light by the plants 813.

Environmental cues are an important characteristic of plant growth, and are a significant factor in determining when plants undergo important physical changes such as, for example, flowering or fruiting. Such environmental cues typically include the temperature of the environment, the number of hours of light the plants receive and the spectrum of light the plants are exposed to. The process of light-mediated development is referred to as photomorphogenesis, and may be regarded as a plant's response to light signals. For example, many plants use the ratio of light intensities between the red portion of the light spectrum (600-700 nm) and the far-red portion of the light spectrum (700-800 nm) to trigger the plant to produce fruit or flowers.

Figure 9:
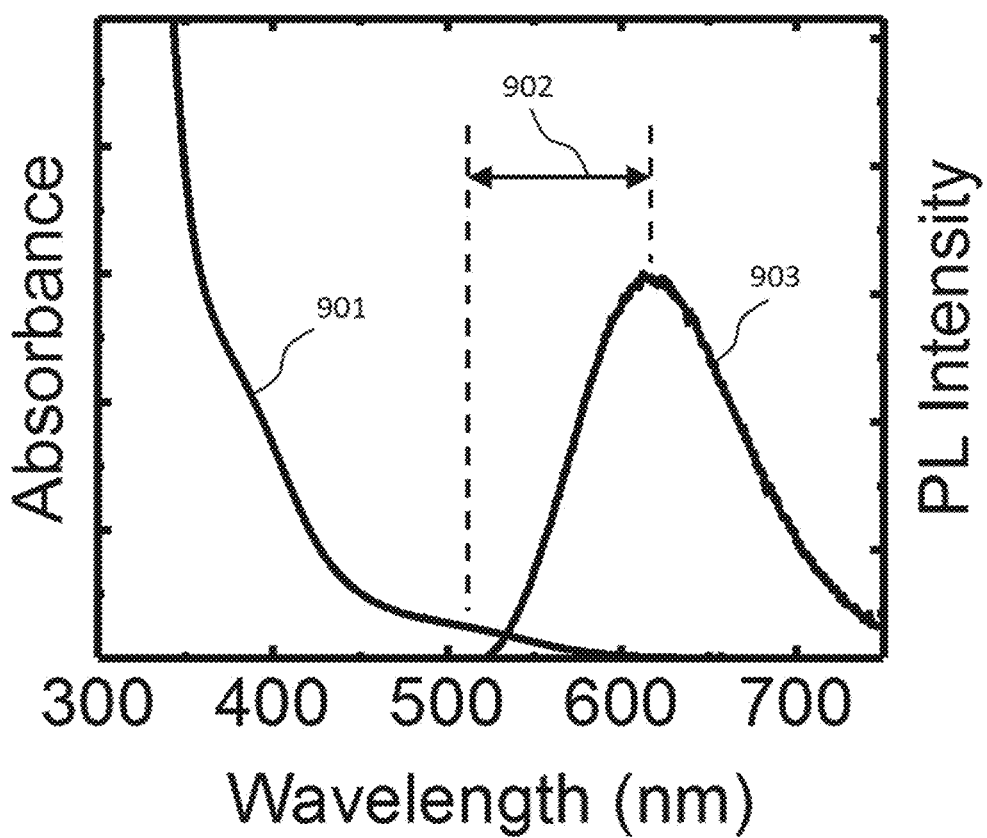
FIG. 9 is a graph of a typical absorption and photoluminescence spectra for $CuInS_2$/ZnS quantum dots. These QDs are substantially free of toxic elements and are believed to be non-carcinogenic. The QDs can have an emission quantum yield of >90%. These QDs have an absorption spectrum with a maximum intensity at wavelengths less than 400 nm.

FIG. 9 is a typical absorption 901 and photoluminescence 903 spectra for CuInZnSeS quantum dots, which are a preferred fluorophore in the devices and methodologies disclosed herein. These quantum dots are substantially free of toxic elements, and are believed to be non-carcinogenic. Moreover, these quantum dots have an emission quantum yield in excess of 70%.

As seen in FIG. 9, CuInZnSeS quantum dots can be made to have minimal overlap 902 between their absorption 901 and photoluminescence 903 peaks. As a result, very little of the radiation emitted by these quantum dots as a result of fluorescence undergoes subsequent reabsorption. Moreover, CuInZnSeS quantum dots may be fabricated with absorption peaks outside of the visible region (typically within the UV region), and with emission spectra within the visible region. Consequently, the photoluminescence process that these quantum dots undergo has the effect of converting a portion of the incident UV radiation into visible wavelengths, thus making them ideal for agricultural applications. Alternatively, these quantum dots may by synthesized in a way that causes them to partially absorb visible wavelengths of light, and to convert a portion of the absorbed radiation into far-red luminescence. Consequently, such quantum dots may be used to trigger or otherwise promote physical changes in plants, such as flowering or fruiting.

Figure 10:
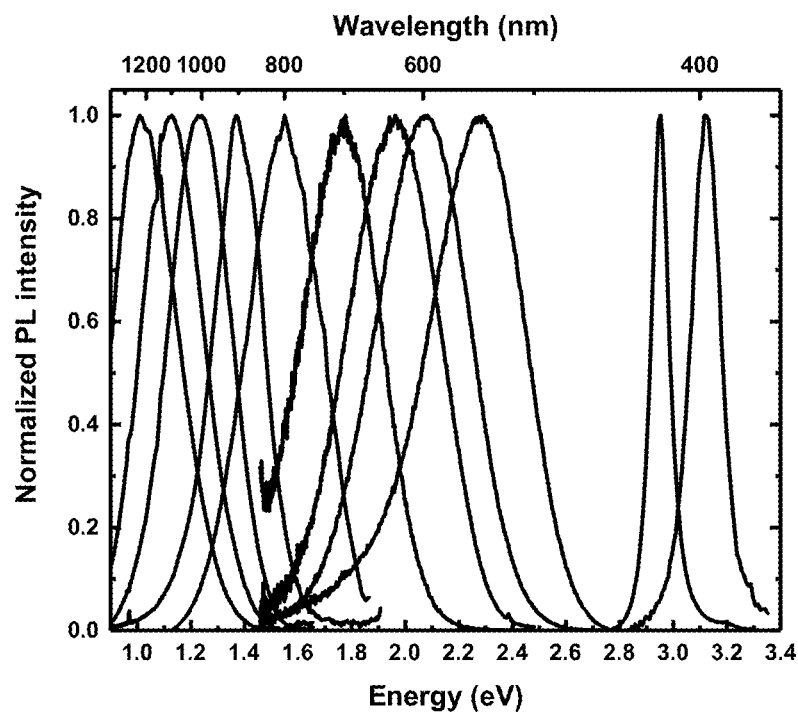
FIG. 10 is a graph of the photoluminescence spectra arising from different sizes and compositions of quantum dots composed of $CuInS_2$, $CuInSe_2$, ZnS, ZnSe, and combinations thereof. The accessible peak emissions with these materials is 400 nm-1200 nm.

The photoluminescent spectrum of the solar concentrators utilized in the devices, structures and methodologies disclosed herein may be modified or tailored as desired through appropriate selection of the luminescent materials and/or the dimensions of these materials. For example, FIG. 10 is a graph of the photoluminescence arising from different sizes and compositions of CuInZnSeS quantum dots. As seen therein, these quantum dots have many different emission wavelengths that span the spectral range from 400-1200 nm. By mixing different combinations of quantum dots, the shape of the spectrum may be readily modified and tailored to the ideal spectrum for a specific plant. The shape of the spectrum, including the number of peaks, the number of troughs, the slope of the spectrum, and other spectral signatures, may be tailored based on the size and composition of the quantum dots chosen.

The QDs mixtures preferably have an emission quantum yield of greater than 50%. It will be appreciated that various mixtures of quantum dots and other luminescent materials may be utilized to achieve a spectral output for the solar concentrators disclosed herein which is most conducive to plant growth. It will also be appreciated that this approach may be utilized to achieve a spectral output that is most conducive to the growth of a particular crop.

Figure 11:
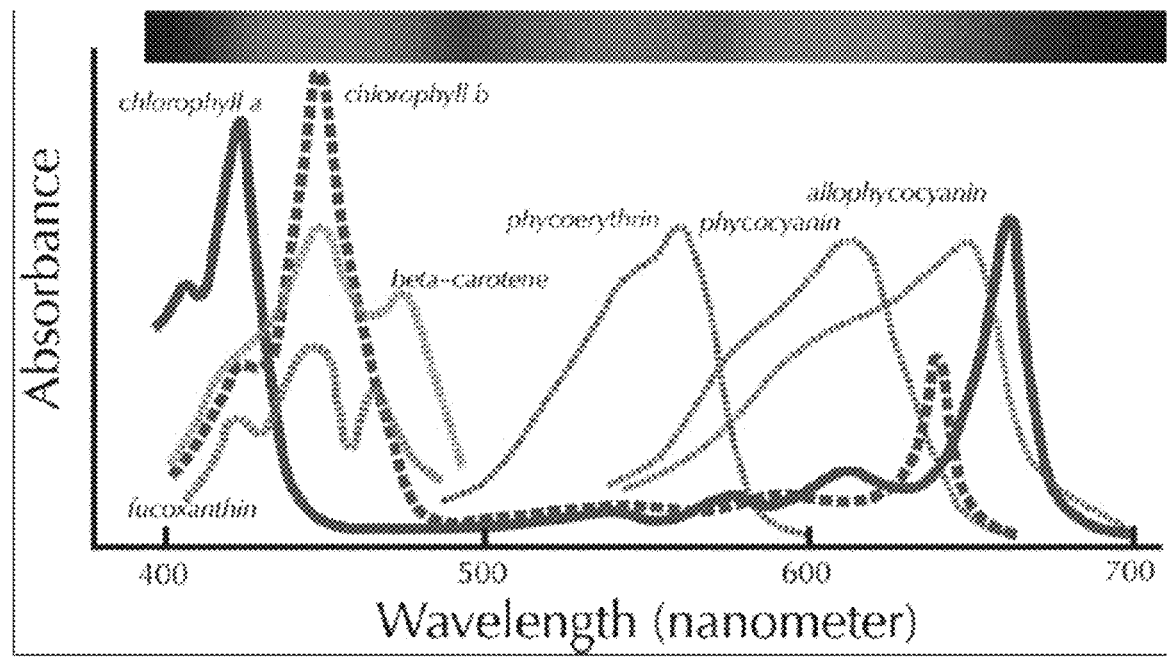
FIG. 11 is a graph excerpted from the book "Plant physiology and development" Sixth edition, published in 2015, that shows various pigments in plants that absorb sunlight. As seen therein, these pigments cover almost all wavelengths from 400-1200 nm.

FIG. 11 is a graph (excerpted from the book "Plant Physiology and Development" (Sixth edition, published in 2015) that shows various pigments in plants that absorb sunlight. As seen therein, these pigments cover almost all wavelengths from 400-1200 nm. Hence, while some prior art approaches to optimizing plant growth deemphasize certain wavelengths of light (such as green wavelengths), this graph underscores the importance of all visible wavelengths to vigorous plant growth. Nonetheless, it will thus be appreciated that, although all visible wavelengths of light may play an important role in plant growth, the relative amount (or flux) of particular wavelengths required for vigorous plant growth may vary and may be utilized as considerations to determining the optimal spectral output for a solar concentrator of the type disclosed herein. It will also be appreciated that the optimal spectral output may vary depending on the particular plants that the solar concentrator will be utilized in conjunction with.

Figure 12:
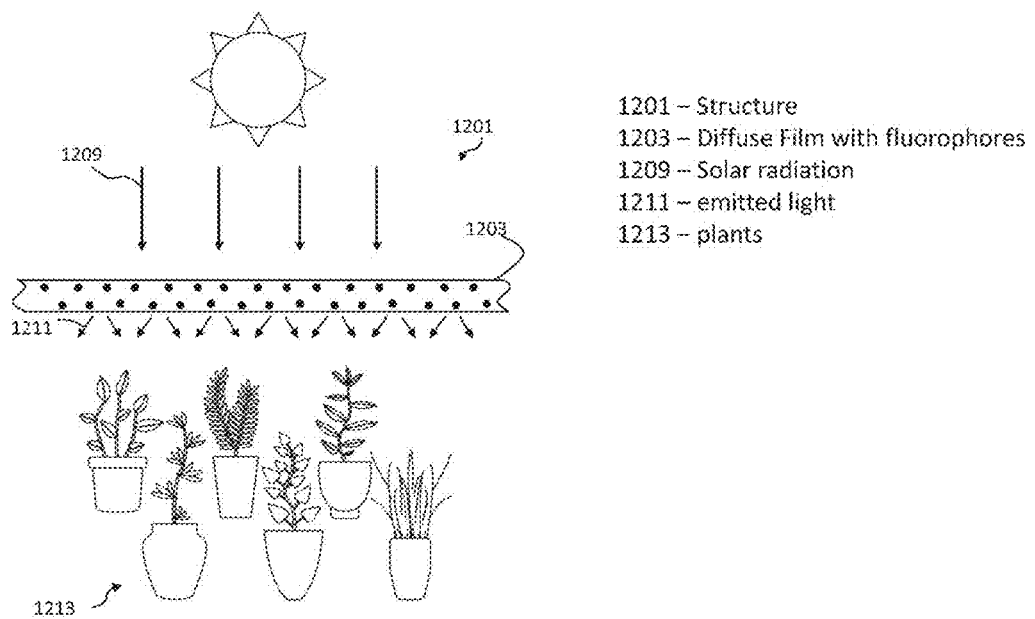
FIG. 12. is an illustration of a greenhouse equipped with a diffuse fluorescent film in accordance with the teachings herein.

FIG. 12 depicts a seventh particular, non-limiting embodiment of a structure in accordance with the teachings herein. As seen therein, the structure 501 depicted is equipped with a series of transparent or partially transparent panels 503 or windows which, in the particular embodiment depicted, form the walls and/or ceilings of a greenhouse. The details of the structure, and the general arrangement of the panels, are not shown, but may be any of the various structures and arrangements as are known to the art of greenhouses.

Each of the panels 1203 in the structure 1201 depicted comprises a suitable fluorophore disposed on a diffuse substrate (or in some embodiments, disposed in a diffuse medium). Suitable substrates include various plastics and glasses. The panels are generally constructed so that they act as solar concentrators for solar radiation impingent thereon.

In use, solar radiation 1209 impinges on said panels 1203, and is directed towards the plants through scattering. The fluorophores in the waveguides are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the waveguides. The emitted light 1211 to impinge upon plants 1213 or vegetation resident therein.

Figure 13:
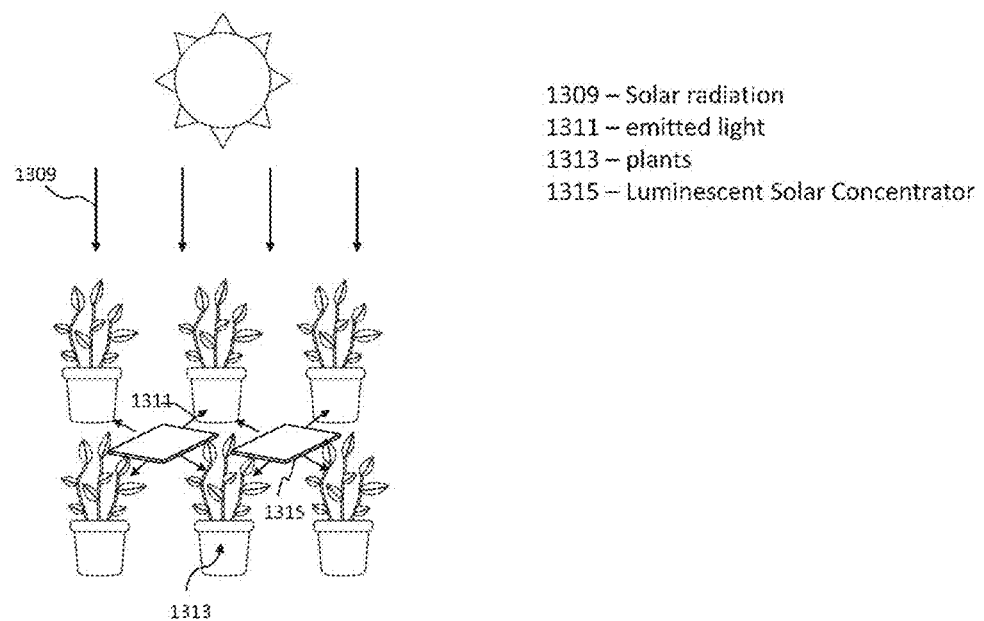
FIG. 13 is an illustration of plants that are placed into containers and luminescent solar concentrators are placed among the plants in accordance with the teachings herein.

FIG. 13 depicts a particular, non-limiting embodiment of a luminescent concentrator in accordance with the teachings herein. As seen therein, plants 1313 are placed into a container among solar concentrators 1315.

In use, solar radiation 1309 impinges on said plants 1313, and any solar radiation 1309 not absorbed by the plants impinges on said luminescent concentrator 1315. The fluorophores in the luminescent concentrator 1315 are excited and undergo fluorescence. As noted above, the fluorophores preferably absorb light outside of the visible region of the spectrum (and more preferably, in the UV region of the spectrum) and emit light in the visible region of the spectrum, thus increasing the flux of visible wavelengths of the light in the luminescent concentrator 1315.

The luminescent concentrator 1315 then allows for the emitted light 1311 to impinge upon plants 1313 or vegetation resident therein from below, thus maximizing the absorption of light by the plants 1313.

Various luminescent materials may be utilized in the devices, structures and methodologies disclosed herein. As previously noted, one class of such materials are the colloidal semiconductor nanocrystals commonly known as quantum dots (QDs). These materials are advantageous in that they provide various size-tunable optical properties (including size tunable photoluminescence), and may be inexpensively processed from liquids. QDs are very effective at absorbing a broad spectrum of light and then converting that energy into emitted light of a single color that is determined by their size. Optical properties (such as, for example, absorption and emission spectra, PL lifetimes and Stokes shift) may be programmed into these materials by tailoring the manufacturing conditions to realize different sizes, shapes, compositions, and/or heterostructuring.

Various types of luminescent concentrators may be utilized in the devices, structures and methodologies described herein. These include, without limitation, the luminescent concentrators described in commonly assigned U.S. Ser. No. 62/341,238 (McDaniel), entitled Laminated Glass Luminescent Concentrator", which was filed on May 25, 2016, and which is incorporated herein by reference in its entirety.

5. Additional Comments

Various modifications, substitutions, combinations, and ranges of parameters may be made or utilized in the compositions, devices and methodologies described herein.

For example, in some embodiments, the photoluminescence of the luminescent material may have a maximum intensity at wavelengths in the range of 400 nm to 1200 nm, more preferably in the range of 500 nm to 900 nm, and most preferably in the range of 550 nm to 750 nm.

In some embodiments, the photoluminescence of the luminescent material may be characterized by a quantum yield of at least 30%, at least 50%, at least 70%, or at least 80%.

Various optical elements may be utilized in the optical paths of the devices and methodologies described herein. For example, in some embodiments, a spectrum selecting optical element may be placed in the optical path between the irradiated article and the incident sunlight. Such an optical element may include, for example, one or more elements selected from the group consisting of light filters, quantum dot films and colored glasses. A spectrum selecting optical element of this type may allow only a given portion of the spectrum to pass.

In some embodiments, two or more distinct types of quantum dots may be utilized in the systems, methodologies and compositions described herein. These quantum dots may be compositionally distinct. For example, the luminescent materials utilized herein may comprise a first type of quantum dot based on a first chemistry, and a second type of quantum dot based on a second chemistry which is distinct from the first chemistry. Thus, for example, the first type of quantum dot may comprise $CuInS_2$, while the second type of quantum dot may comprise $AgInSe_2$. Similarly, the luminescent materials described herein may comprise a first type of quantum dot based on a first set of dimensions (or distribution of dimensions) of the quantum dots, and a second type of quantum dot based on a second set of dimensions (or distribution of dimensions) of the quantum dots which is distinct from the first set of dimensions (or distribution of dimensions) of the quantum dots. Thus, for example, the first type of quantum dot may comprise generally spherical quantum dots having a first diameter (e.g., 10 nm), and the second type of quantum dot may comprise generally spherical quantum dots having a second diameter (e.g., 30 nm).

The devices, structures and methodologies disclosed herein have frequently been described herein in reference to their use in agricultural applications in general, and in greenhouses in particular. However, one skilled in the art will appreciate that these devices, structures and methodologies may be employed in various other applications as well including, for example, general indoor lighting applications.

Fluorophores having various optical properties may be utilized in the devices and methodologies disclosed herein. Preferably, these fluorophores are quantum dots. These fluorophores typically have a quantum yield of at least 20% preferably at least 40%, more preferably greater than 50%, even more preferably at least 60%, and most preferably at least 75%.

The fluorophores utilized in the devices and methodologies disclosed herein preferably have an absorption spectrum with a maximum intensity at wavelengths less than 400 nm, and emit a spectrum of light having a maximum intensity at wavelengths within the range of 400 nm to 1200 nm. In some embodiments, these fluorophores may emit a spectrum of light having a maximum intensity at wavelengths greater than 550 nm. Optical elements which include these fluorophores preferably have a transparency of greater than 75% at wavelengths within the range of 600 nm to 1200 nm. These fluorophores preferably have low self-absorption such that their photoluminescence is absorbed by less than 50% across the integrated emission spectrum by said fluorophores embedded in said medium over distances of at least 1 mm, preferably over distances of at least 1 cm, more preferably over distances of at least 1 m, even more preferably over distances of at least 2 m, and most preferably over distances of at least 10 m. These fluorophores also preferably have a Stokes shift greater than 100 meV.

In the optical elements disclosed herein, the fluorophores may be disposed within a medium. The medium may comprise various materials, although the use of polymeric materials that allow transmittance of the photoluminescence of the fluorophores is especially preferred. Preferred polymeric materials for the medium include those selected from the group consisting of ethylene-vinyl acetate, polyvinyl butyral, thermoplastic polyurethane, urethanes, acrylates, poly(methyl methacrylate), poly (lauryl methacrylate), cyclic olefin polymer, cellulose, ionoplast, epoxies, polycarbonate, and silicone. In some embodiments, the medium may be prepared or disposed between sheets selected from the group consisting of moisture barrier films, oxygen barrier films, or glass. The medium, or the optical element as a whole, may be formed by various processes, including extrusion processes.

The optical elements disclosed herein may include, or may be utilized in conjunction with, various other materials or devices. For example, the optical elements disclosed herein may include, or may be utilized in conjunction with, various materials that have specular or diffuse reflectance or transmittance, and with various types of mirrors, reflectors, diffusers, and optical waveguides. Suitable waveguides may include, but are not limited to, those selected from the group consisting of fiber optic cables, photonic-crystal fibers, flexible waveguiding plastics, mirrored cavities and plasmonic cavities.

The optical elements disclosed herein may be utilized in conjunction with various structures. These include, without limitation, various buildings (including residential and office buildings), various structures (including greenhouses), and various components thereof, including roofs, walls, windows, and window frames.

The media utilized in the devices disclosed herein may be fabricated in various shapes and geometries. Thus, for example, the media may be fabricated with one or more curved sections, with at least one section with at least one shape selected from the group consisting of concave, convex and cylindrical, or with at least one section with at least one shape selected from the group consisting of dome and spherical.

The above description of the present invention is illustrative and is not intended to be limiting. It will thus be appreciated that various additions, substitutions and modifications may be made to the above described embodiments without departing from the scope of the present invention. Accordingly, the scope of the present invention should be construed in reference to the appended claims.

Moreover, it is specifically contemplated that the features described in the appended claims may be arranged in different combinations or sub-combinations without departing from the scope of the present disclosure. For example, it is contemplated that features set forth in two or more claims may be combined into a single claim without departing from the scope of the present disclosure, whether or not the resulting combination of features is explicitly disclosed elsewhere in the appended claims or disclosure.

What is claimed is:

1. In combination with a greenhouse, an optical element which forms a wall or ceiling of said greenhouse, said optical element comprising:

a plurality of fluorophores disposed in a medium;

wherein said fluorophores have a quantum yield greater than 50%, wherein said fluorophores have an absorption spectrum with a maximum intensity at wavelengths less than 400 nm, wherein said fluorophores emit a spectrum of light having a maximum intensity at wavelengths within the range of 400 nm to 1200 nm, wherein said medium is at least partially transparent at the wavelength where the maximum intensity of the emission spectrum is realized, and wherein said optical element is not optically coupled to a photovoltaic cell;

wherein said fluorophores are quantum dots comprising a material selected from the group consisting of $CuInS_2$, $CuInSe_2$, ZnS, ZnSe, and alloys of the foregoing; and wherein said fluorophores embedded in said medium have a photoluminescence, and wherein less than 50% of said photoluminescence which propagates through said medium undergoes self-absorption by said fluorophores over distances of propagation of at least 1 mm.

2. The optical element of claim 1, wherein said fluorophores emit a spectrum of light having a maximum intensity at wavelengths within the range of 550 nm to 1200 nm.

3. The optical element of claim 1, wherein said optical element has a transparency of greater than 75% at wavelengths within the range of 600 nm to 1200 nm.

4. The optical element of claim 1, wherein said fluorophores have a Stokes shift greater than 100 meV.

5. The optical element of claim 1, wherein said medium is a polymer that allows transmittance of said photoluminescence.

6. The optical element of claim 1, wherein said medium is selected from the group consisting of ethylene-vinyl acetate, polyvinyl butyral, thermoplastic polyurethane, polyethylene, polyethylene terephthalate, urethanes, acrylates, poly(methyl methacrylate), poly (lauryl methacrylate), cyclic olefin polymer, cellulose, ionoplast, epoxies, polycarbonate, and silicone.

7. The optical element of claim 1, wherein said medium is disposed between sheets selected from the group consisting of moisture barrier films, oxygen barrier films, or glass.

8. The optical element of claim 1, constructed by an extrusion process.

9. The optical element of claim 1, in combination with at least one element selected from the group consisting of mirrors and diffusers.

10. The optical element of claim 1, in combination with at least one optical waveguide.

11. The optical element of claim 10, wherein said optical waveguide is selected from the group consisting of fiber optic cable, photonic-crystal fiber, flexible waveguiding plastic, mirrored cavity, and plasmonic cavity.

12. The optical element of claim 1, wherein said medium has at least one section with at least one shape selected from the group consisting of concave, convex and cylindrical.

13. The optical element of claim 1, wherein said medium has at least one section with at least one shape selected from the group consisting of dome and spherical.

14. The optical element of claim 1, wherein said fluorophore has a quantum yield of at least 60%.

15. The optical element of claim 1, in combination with an element selected from the group consisting of window frames and buildings.

16. A combination of at least two optical elements of claim 1, wherein each optical element has distinct fluorophores that absorb different portions of a light spectrum.

17. A combination of at least two optical elements of claim 1, wherein each optical element has distinct fluorophores that emit different spectra of light.

18. The optical element of claim 1, wherein less than 50% of said photoluminescence is absorbed by said fluorophores over distances of at least 1 cm.

19. The optical element of claim 1, wherein less than 50% of said photoluminescence is absorbed by said fluorophores over distances of at least 1 m.

20. The optical element of claim 1, wherein less than 50% of said photoluminescence is absorbed by said fluorophores over distances of at least 10 m.

21. The optical element of claim 1, wherein said fluorophores are quantum dots comprising a material selected from the group consisting of $CuInS_2$, $CuInSe_2$ and alloys of the foregoing.

22. The optical element of claim 1, wherein said greenhouse comprises a plurality of panels supported by structural elements, and wherein each of said plurality of panels comprises an instance of said optical element.

23. The optical element of claim 22, wherein each of said panels is equipped with a waveguide through which light impinging on said panel is directed, wherein each waveguide has said plurality of fluorophores disposed therein, and wherein each waveguide is equipped with an extractor which extracts light from said waveguide into the interior of said greenhouse.

24. The optical element of claim 23, wherein said waveguide directs the light impinging on the panel to the edge of the panel.

25. In combination with a greenhouse, an optical element which forms a wall or ceiling of said greenhouse, said optical element comprising:
a plurality of fluorophores disposed in a medium;
wherein said fluorophores have a quantum yield greater than 50%, wherein said fluorophores have an absorption spectrum with a maximum intensity at wavelengths less than 400 nm, wherein said fluorophores emit a spectrum of light having a maximum intensity at wavelengths within the range of 400 nm to 1200 nm, wherein said medium is at least partially transparent at the wavelength where the maximum intensity of the emission spectrum is realized, and wherein said optical element is not optically coupled to a photovoltaic cell; and
wherein said fluorophores are quantum dots comprising a material selected from the group consisting of $CuInS_2$, $CuInSe_2$ and alloys of the foregoing.

* * * * *